(12) United States Patent
Fukuta

(10) Patent No.: US 7,786,728 B2
(45) Date of Patent: Aug. 31, 2010

(54) MAGNETIC RESONANCE IMAGING APPARATUS AND MAGNETIC RESONANCE IMAGING METHOD

(75) Inventor: Toshio Fukuta, Otawara (JP)

(73) Assignees: Kabushiki Kaisha Toshiba, Minato-Ku, Tokyo (JP); Toshiba Medical Systems Corporation, Otawara-shi, Tochigi-ken (JP)

( * ) Notice: Subject to any disclaimer, the term of this patent is extended or adjusted under 35 U.S.C. 154(b) by 126 days.

(21) Appl. No.: 12/260,314

(22) Filed: Oct. 29, 2008

(65) Prior Publication Data

US 2009/0115794 A1 May 7, 2009

(30) Foreign Application Priority Data

Nov. 2, 2007 (JP) ............................. 2007-286273

(51) Int. Cl.
*G01V 3/00* (2006.01)
(52) U.S. Cl. ........................ 324/307; 324/309
(58) Field of Classification Search ......... 324/300–322; 600/407–445
See application file for complete search history.

(56) References Cited

U.S. PATENT DOCUMENTS

| | | | |
|---|---|---|---|
| 5,529,069 A * | 6/1996 | Andoh ................... 600/410 |
| 6,771,068 B2 * | 8/2004 | Dale et al. ............... 324/307 |
| 7,309,985 B2 * | 12/2007 | Eggers et al. ............ 324/309 |
| 7,408,345 B2 * | 8/2008 | Bammer et al. .......... 324/307 |
| 2008/0021304 A1 * | 1/2008 | Stemmer ................. 600/410 |
| 2008/0169808 A1 * | 7/2008 | Taniguchi et al. ....... 324/307 |
| 2009/0148021 A1 * | 6/2009 | Yui ........................ 382/131 |
| 2010/0013475 A1 * | 1/2010 | Kimura .................. 324/307 |

FOREIGN PATENT DOCUMENTS

WO      2005/023108      3/2005

OTHER PUBLICATIONS

James G. Pipe, "Motion Correction with Propeller MRI: Application to Head Motion and Free-Breathing Cardiac Imaging", Magnetic Resonance in Medicine 42:963-969 (1999).

* cited by examiner

*Primary Examiner*—Brij B Shrivastav
(74) *Attorney, Agent, or Firm*—Nixon & Vanderhye PC

(57) ABSTRACT

A magnetic resonance imaging apparatus includes an acquisition unit, a calculation unit, a recalculation unit, a correction unit and a generating unit. The acquisition unit acquires data from plural slices in an object by rotating a zonary region in frequency space by every repetition time. The calculation unit calculates correction parameters for motion correction. The recalculation unit recalculates at least a part of the correction parameters based on relationship between values of the correction parameters and at least one of real-spatial positions and times at which the data is acquired. The correction unit corrects the data using correction parameters including recalculated correction parameters. The generating unit generates image data based on corrected data.

20 Claims, 8 Drawing Sheets

MAGNETIC RESONANCE IMAGING APPARATUS AND MAGNETIC RESONANCE IMAGING METHOD

This application claims priority to Japanese Application No. 2007-286273, filed 2 Nov. 2007, the entire contents of each of which are hereby incorporated by reference.

BACKGROUND OF THE INVENTION

1. Field of the Invention

The present invention relates to a MRI (magnetic resonance imaging) apparatus and a magnetic resonance imaging method which excite nuclear spin of an object magnetically with a RF (radio frequency) signal having the Larmor frequency and reconstruct an image based on NMR (nuclear magnetic resonance) signals generated due to the excitation, and more particularly, to a magnetic resonance imaging apparatus and a magnetic resonance imaging method which acquire k-space data in frequency space (k-space) in non-Cartesian state by rotating a zonary region, referred to blade, formed by plural parallel data acquisition loci by every TR (repetition time) and fill the k-space data in the k-space.

2. Description of the Related Art

Magnetic resonance imaging is an imaging method which excites nuclear spin of an object set in a static magnetic field with a RF signal having the Larmor frequency magnetically and reconstructs an image based on a MR (magnetic resonance) signal generated due to the excitation.

As one of data acquisition methods in the field of magnetic resonance imaging, there is a method for acquiring and filling up k space data in the frequency region in non-Cartesian (nonorthogonal) state by rotating, at every repetition time, a zonal region called a blade formed by multiple parallel data acquisition loci (see, for example, "Multishot Diffusion-Weighted FSE Using PROPELLER MRI", Pipe et al., Magnetic Resonance in Medicine 47:42-52(2002)). This method is sometimes referred to as PROPELLER (periodically rotated overlapping parallel lines with enhanced reconstruction) method or BLADE method. The method is henceforth called simply the blade rotating data acquisition method. And a pulse sequence according to the blade rotating data acquisition method is referred to as a blade rotation data acquisition sequence.

In the blade rotating data acquisition method, data is acquired in each blade by an imaging method, such as a FSE (fast spin echo) method, which can perform multi shots. Further, the blade rotating data acquisition method is a scanning method for rotating a blade around the origin of the k space as the center by changing gradient magnetic fields to form multiple blades radially around the origin of the k space as the center.

That is, in the blade rotation data acquisition sequence, in order to acquire pieces of data in different blades, a frequency encoding gradient magnetic field pulse showing mutually different patterns with respect to respective blades is applied. More specifically, with an absolute value intensity |Gf| of the frequency encoding gradient magnetic field pulse Gf maintained, only an application direction of the frequency encoding gradient magnetic field pulse Gf is changed by changing an intensity ratio Gx:Gy ($Gf^2=Gx^2+Gy^2$=const) between an x-axis direction component Gx and an y-axis direction component Gy of the frequency encoding gradient magnetic field pulse. Herewith data acquisition points within a blade in the k space (Fourier space) that is a spatial frequency region rotate on the same plane.

FIG. 1 is a diagram showing an example of data sampling using a conventional blade rotation data acquisition sequence.

FIG. 1 (a) shows an example of a frequency encoding gradient magnetic field pulse Gx in x axis direction. FIG. 1 (b) shows an example of a frequency encoding gradient magnetic field pulse Gy in y axis direction. FIG. 1 (c) shows data acquisition points in k-space by applying a frequency encoding gradient magnetic field pulse Gf having an intensity ratio shown in (a) and (b) of FIG. 1. The respective ordinate axes of (a) and (b) of FIG. 1 denote intensities of the frequency encoding gradient magnetic field pulse Gx which is x axis direction component and the frequency encoding gradient magnetic field pulse Gy which is y axis direction component respectively. The abscissa axes of (a) and (b) of FIG. 1 denote time. The abscissa axis of FIG. 1 (c) denotes frequency Kx in k-space corresponding to spatial position in x axis direction. The ordinate axis of FIG. 1 (c) denotes frequency Ky in k-space corresponding to spatial position in y axis direction.

As shown in FIG. 1 (a) and FIG. 1 (b), for example, when the intensity ratio between the x-axis direction component Gx and the y-axis direction component Gy of the frequency encoding gradient magnetic field pulse is equal, the data acquisition points in the k space as shown in FIG. 1 (c) lie in a straight line declining by an angle of 45 degrees from the frequency axes Kx and Ky corresponding to the x-axis and y-axis respectively.

Data is acquired by an imaging method that can perform multi shots as described above, and a FSE sequence is generally employed. In the normal FSE sequence, the number of data equivalent to an ETL (echo train length) is acquired per single excitation from data acquisition points on plural parallel lines in a same direction. Consequently, data acquisition locus equivalent to the ETL becomes a zonal area, and this zonal area configures one blade. In other words, data for one blade is acquired by one excitation.

Then, excitation is repeated by times equivalent to the number of shots and pieces of data within multiple blades are sequentially acquired. At this time, rotating the blade with respect to each excitation fills up data at all data acquisition points in the k space.

FIG. 2 is a diagram showing k-space filled with data acquired by the conventional blade rotation data acquisition sequence.

In FIG. 2, the abscissa axis denotes position Kro in the RO (readout) direction in k-space and the ordinate axis denotes position Kpe in the PE (phase encode) direction in k-space. The respective points in FIG. 2 denote data acquisition positions.

As shown in FIG. 2, for example, the x-axis direction is regarded as the RO direction and the y-axis direction is regarded as the PE direction. FIG. 2 shows an example in case where data is acquired from 6 blades having mutually different directions from blade No. 0 to blade No. 5 respectively. Data is acquired from data acquisition points on three parallel lines within each blade. This type of data acquisition from plural blades having mutually different directions fills up data at all data acquisition points in the k space ultimately.

Since data acquired by the foregoing blade rotation data acquisition sequence is influenced due to motion of an object that is a patient, correction processing is performed to eliminate the influence of the motion from data. Specifically, correction of a relative rotational and a translational amount is performed among pieces of data belonging to mutually different blades to eliminate the influence of the rotational and translational motion of the object among blades. This correction, for example, is performed by performing FT (Fourier transform) of data corresponding to each blade in the k space once, then by canceling a relative rotational movement and translational movement among respective images acquired corresponding to plural blades by correction, and subsequently by restoring the corrected data to data in the k space by the inverse FT. The correction of the relative rotational movement and translational movement among the respective images can be performed by rotating and/or moving the respective images so that the cross-correlation of each image obtained by correlation processing with a certain reference image increases (see, for example, "Effect of Motion Correction Associated with Echo Train Length and Number of Blades in PROPELLER MRI-Computer Simulation", Isao Micro et al., JAPANESE JOURNAL OF RADIOLOGICAL TECHNOLOGY, Vol. 60 No. 2 pp. 264-269 FEBRUARY 2004).

In addition, weighting processing is performed to exclude data that is subjected to correction of a rotational amount and a translational amount but not appropriately corrected due to the influence of motion between slices and the nonrigid motion from a target of image reconstruction processing.

The foregoing motion correction is separately performed with respect to each slice. This means the motion correction of data is performed per slice, and performed per blade in each slice.

Since data after the motion correction in the K-space is data in the nonorthogonal coordinate system, it is converted into data in the Cartesian coordinate system by gridding processing. An image for displaying is reconstructed by FT of the data in the Cartesian coordinate system.

However, when performing the conventional motion correction on data acquired by the blade rotation data acquisition sequence, there is a problem that an artifact might occur in an image. This caused by the possibility that an error occurs in correction processing and a correction amount becomes an abnormal value depending on a motion correction algorithm and data to be corrected. That is, when correction of a relative rotational amount and translational amount or weighting processing among blades is performed using an abnormal correction amount acquired by correction processing, a remarkable artifact may be generated.

In particular, when performing a rotational correction on data showing a low sensitivity to a rotation like data acquired from a parietal region to obtain an axial image of head part, namely having a high isotropy to a rotation, errors occur and correction amounts become abnormal values frequently. In such a case, it is known that an artifact called Crinkling occurs.

SUMMARY OF THE INVENTION

The present invention has been made in light of the conventional situations, and it is an object of the present invention to provide a magnetic resonance imaging apparatus and a magnetic resonance imaging method which make it possible to suppress artifact or reduce occurrence frequency of artifact by more appropriate motion correction of an object of data acquired under a data acquisition method by which a zonary region, referred to blade, formed by plural parallel data acquisition loci in frequency space is rotated by every TR.

The present invention provides a magnetic resonance imaging apparatus comprising: a data acquisition unit configured to acquire data based on nuclear magnetic resonance from plural slices in an object by rotating a zonary region formed by plural parallel data acquisition loci in frequency space by every repetition time; a correction parameter calculation unit configured to calculate correction parameters for motion correction with regard to the object of the data; a correction parameter recalculation unit configured to recalculate at least a part of the correction parameters based on relationship between values of the correction parameters and at least one of real-spatial positions and times at which the data is acquired; a data correction unit configured to correct the data using correction parameters including correction parameters recalculated by said correction parameter recalculation unit; and a image data generating unit configured to generate image data based on data corrected by said data correction unit, in an aspect to achieve the object.

The present invention also provides a magnetic resonance imaging apparatus comprising: a static magnetic field generation unit configured to apply a static magnetic field to an object; a gradient magnetic field generation unit configured to apply a gradient magnetic field to the object; a radio frequency magnetic field generation unit configured to expose a radio frequency magnetic field pulse inducing a nuclear magnetic resonance to nuclear spins in the object; an echo signal detection unit configured to detect echo signals emitted due to the nuclear magnetic resonance; a control unit configured to control said gradient magnetic field generation unit, said radio frequency magnetic field generation unit and said echo signal detection unit so as to perform an operation by every repetition time with regard to each of plural blades declining at mutually different angles, the operation being to acquire echo signals for one blade having plural parallel data acquisition loci, in a frequency space in which data of the echo signals is arranged, of which one locus passes an original point in the frequency space within the repetition time; a calculation unit configured to calculate correction parameters for motion correction of respective pieces of data in plural blades based on correlation information with regard to the plural blades; a correction unit configured to correct the respective pieces of the data in the plural blades based on the correction parameters; and an image reconstruction unit configured to relocate data corrected by said correction unit in the frequency space and reconstruct an image with Fourier transformation based on the corrected data, in an aspect to achieve the object.

The present invention also provides a magnetic resonance imaging method comprising: acquiring data based on nuclear magnetic resonance from plural slices in an object by rotating a zonary region formed by plural parallel data acquisition loci in frequency space by every repetition time; calculating correction parameters for motion correction with regard to the object of the data; recalculating at least a part of the correction parameters based on relationship between values of the correction parameters and at least one of real-spatial positions and times at which the data is acquired; correcting the data using correction parameters including the recalculated correction parameters; and generating image data based on the corrected data, in an aspect to achieve the object.

The present invention also provides a magnetic resonance imaging method comprising: applying a static magnetic field to an object; applying a gradient magnetic field to the object; exposing a radio frequency magnet-c field pulse Inducing a nuclear magnetic resonance to nuclear spins in the object; detecting echo signals emitted due to the nuclear magnetic resonance; controlling the gradient magnetic field, the radio frequency magnetic field pulse and detection of the echo signals so as to perform an operation by every repetition time with regard to each of plural blades declining at mutually different angles, the operation being to acquire echo signals for one blade having plural parallel data acquisition loci, in a frequency space in which data of the echo signals is arranged, of which one locus passes an original point in the frequency space within the repetition time; calculating correction parameters for motion correction of respective pieces of data in plural blades based on correlation information with regard to the plural blades; correcting the respective pieces of the data in the plural blades based on the correction parameters; and relocating the corrected data in the frequency space and reconstructing an image with Fourier transformation based on the corrected data, in an aspect to achieve the object.

The magnetic resonance imaging apparatus and the magnetic resonance imaging method according to the present invention as described above make it possible to suppress artifact or reduce occurrence frequency of artifact by more appropriate motion correction of an object to data acquired under a data acquisition method by which a zonary region, referred to blade, formed by plural parallel data acquisition loci in frequency space is rotated by every TR.

DESCRIPTION OF THE PREFERRED EMBODIMENTS

A magnetic resonance imaging apparatus and a magnetic resonance imaging method according to embodiments of the present invention will be described with reference to the accompanying drawings.

Figure 1:
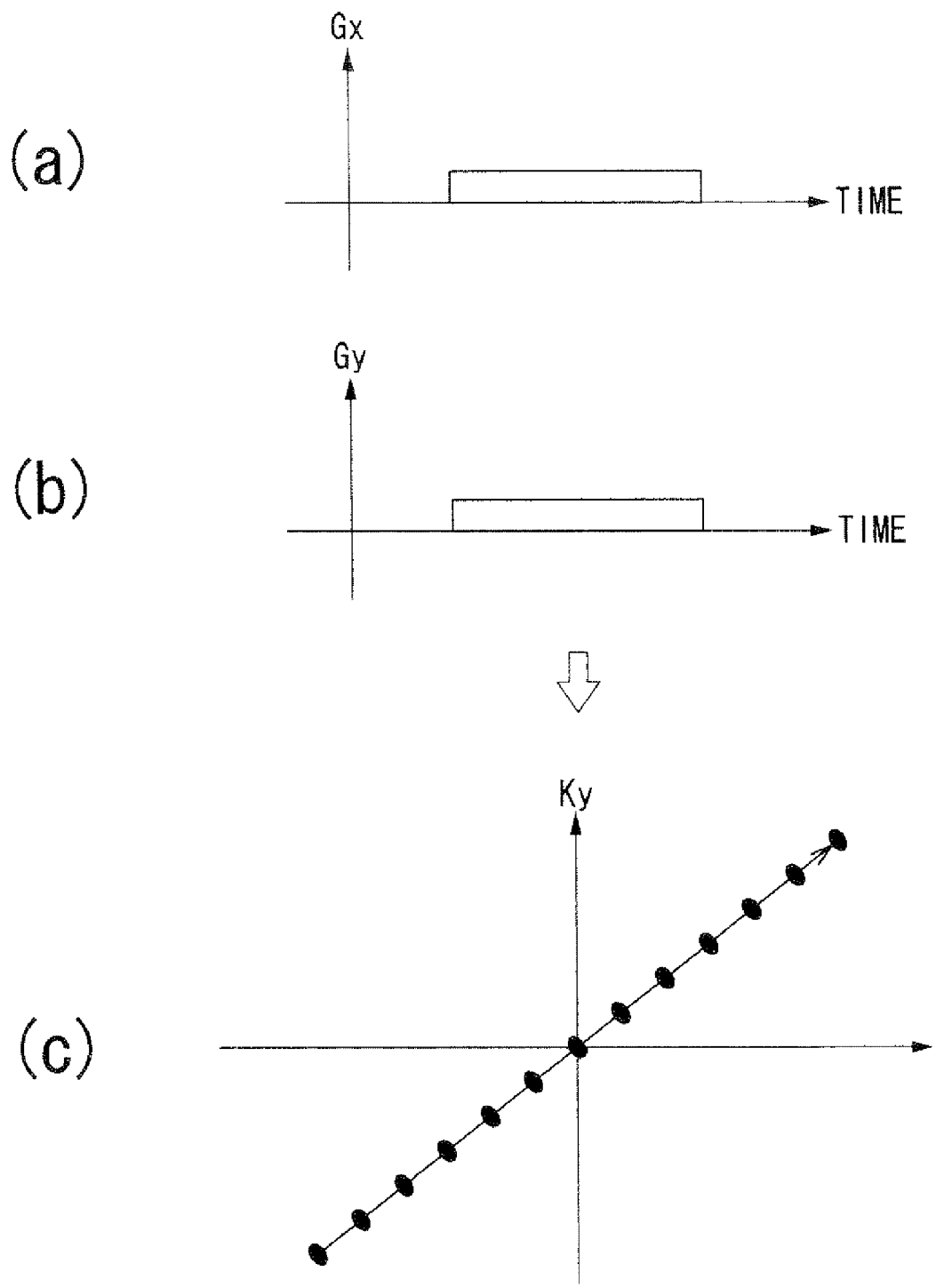
FIG. 1 is a diagram showing an example of data sampling using a conventional blade rotation data acquisition sequence.
Figure 2:
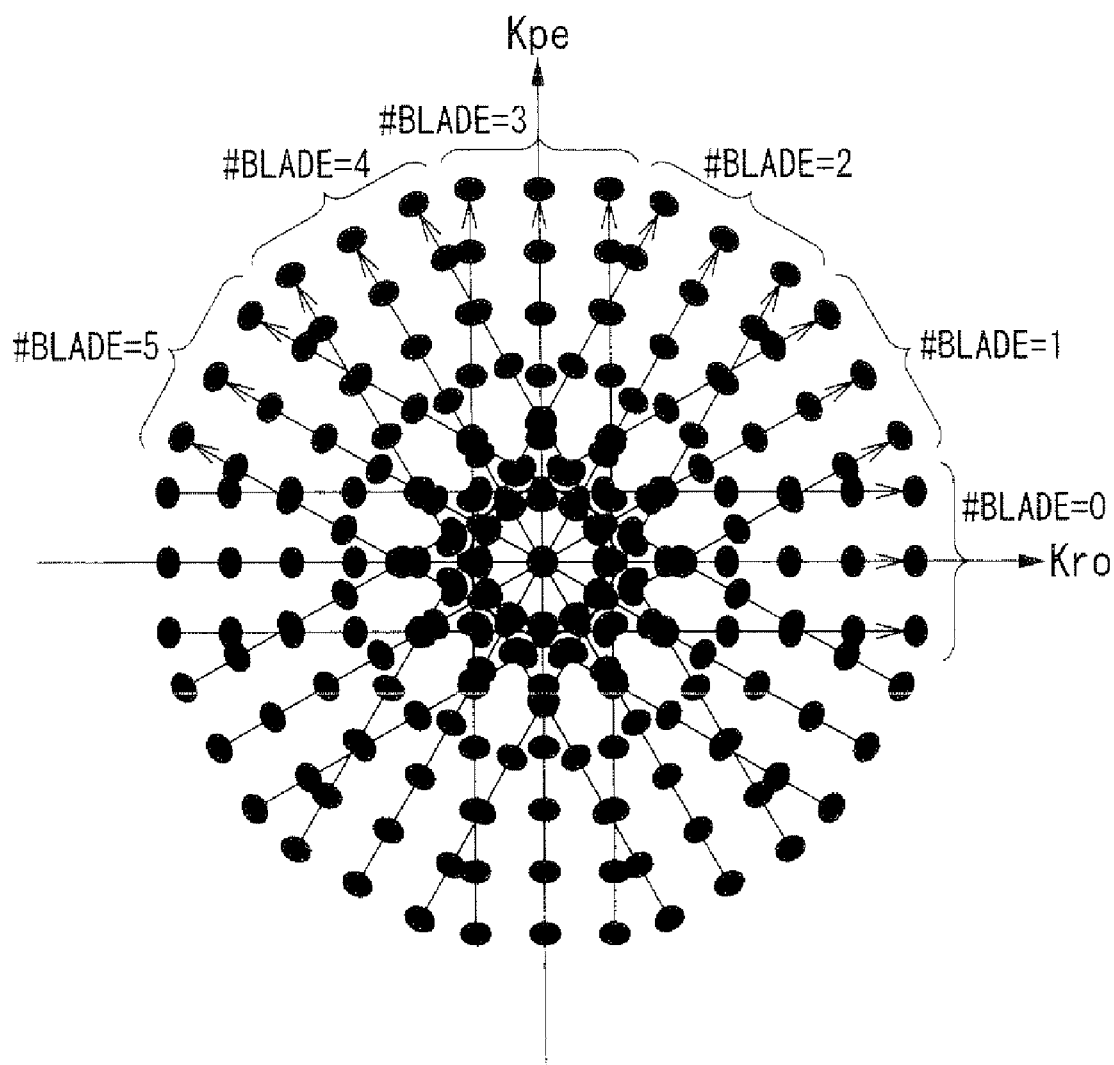
FIG. 2 is a diagram showing k-space filled with data acquired by the conventional blade rotation data acquisition sequence.
Figure 3:
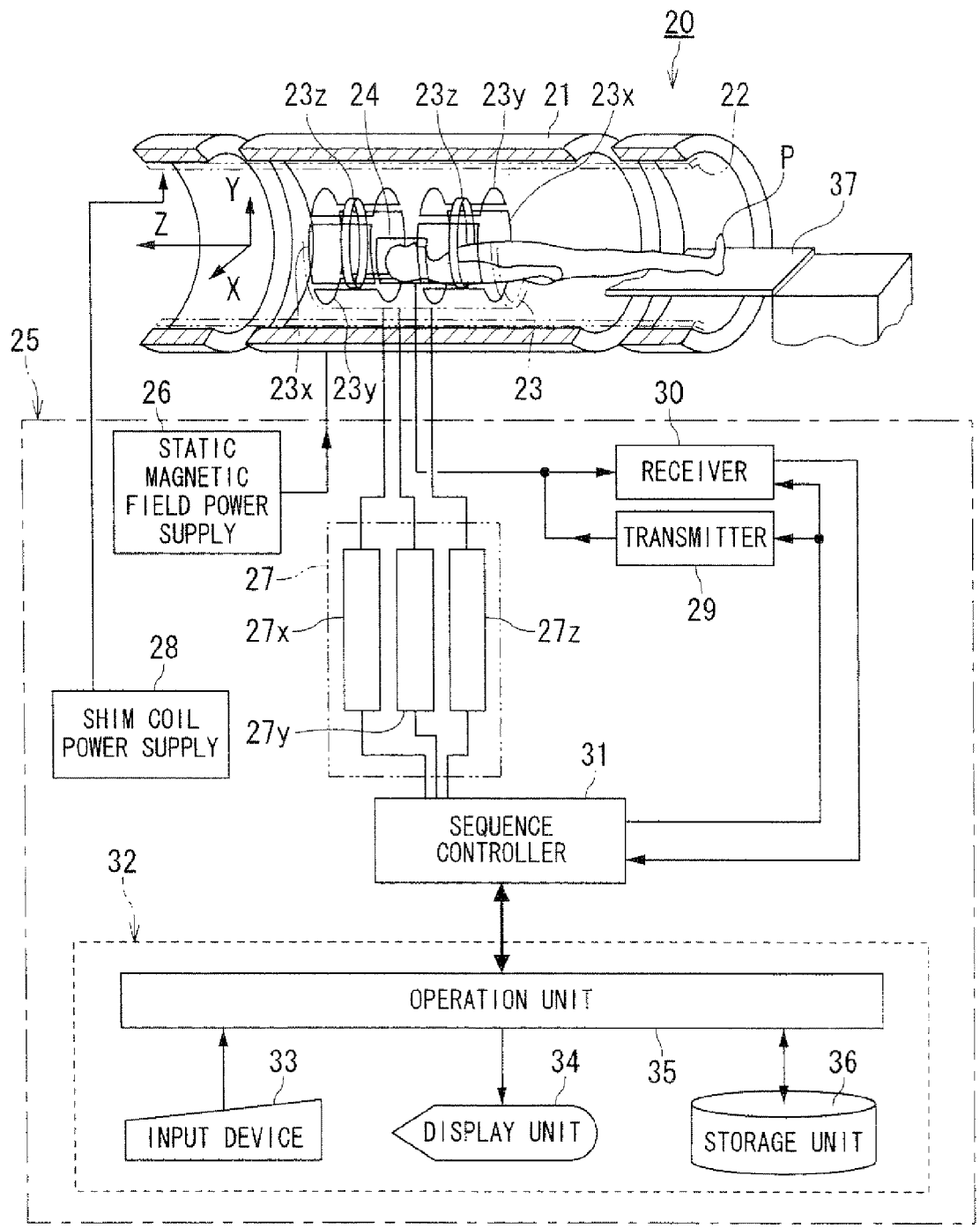
FIG. 3 is a block diagram showing a magnetic resonance imaging apparatus according to an embodiment of the present invention.

FIG. 3 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and a RF coil 24. The static field magnet 21 the shim coil 22, the gradient coil 23 and the RE coil 24 are built in a gantry (not shown).

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, a operation unit 35 and a storage unit 36.

The static field magnet 21 communicates with the static magnetic field power supply 26. The static magnetic field power supply 26 supplies electric current to the static field magnet 21 to get the function to generate a static magnetic field in a imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. Around the bed 37 or the object P, the RF coil 24 may be arranged instead of being built in the gantry.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coil 24 communicates with the transmitter 29 and the receiver 30. The RF coil 24 has a function to transmit a RF signal given from the transmitter 29 to the object P and receive a NMR signal generated due to an nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined sequence stored. The control information above-described includes motion control information such as intensity, impression period and impression timing of the pulse electric current which should be impressed to the gradient power supply 27

The sequence controller 31 is also configured to give raw data to the computer 32. The raw data is complex data obtained through the detection of a NMR signal and A/D (analog to digital) conversion to the NMR signal detected in the receiver 30.

The transmitter 29 has a function to give a RF signal to the RF coil 24 in accordance with control Information provided from the sequence controller 31. The receiver 30 has a function to generate raw data which is digitized complex number data by detecting a NMR signal given from the RF coil 24 and performing predetermined signal processing and A/D converting to the NMR signal detected. The receiver 30 also has a function to give the generated raw data to the sequence controller 31.

The computer 32 gets various functions by the operation unit 35 executing some programs stored in the storage unit 36 of the computer 32. Alternatively, some specific circuits having various functions may be provided with the magnetic resonance imaging apparatus 20 instead of using some of the programs.

Figure 4:
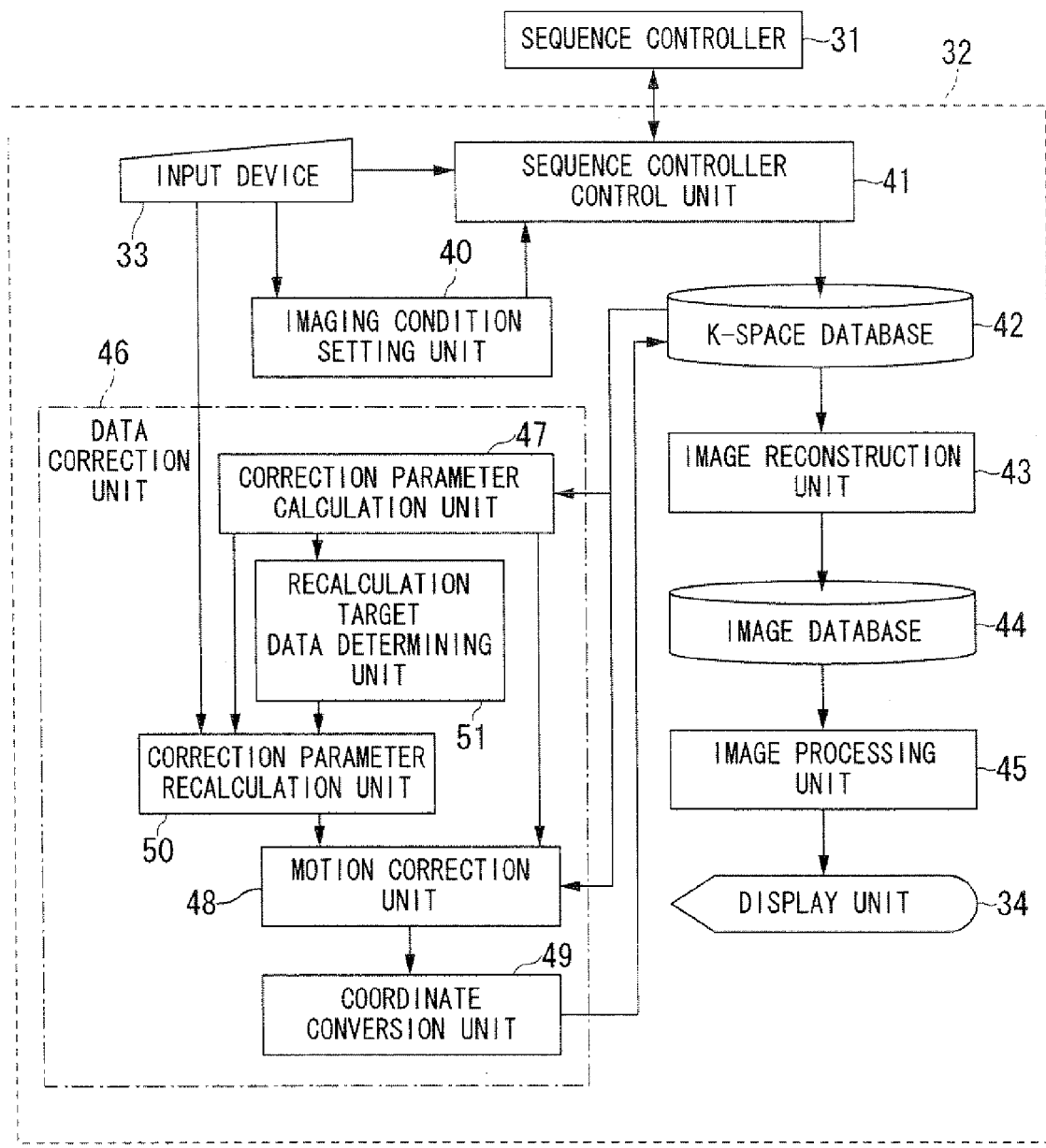
FIG. 4 is a functional block diagram of the computer shown in FIG. 3.

FIG. 4 is a functional block diagram of the computer 32 shown in FIG. 3.

The computer 32 functions as an imaging condition setting unit 40, a sequence controller control unit 41, a k-space database 42, an image reconstruction unit 43, an image database 44, an image processing unit 45 and a data correction unit 46 by program. The data correction unit 46 includes a correction parameter calculation unit 47, a motion correction unit 48, a coordinate conversion unit 49, a correction parameter recalculation unit 50 and a recalculation target data determining unit 51.

The imaging condition setting unit 40 has a function to set an imaging condition by selecting a pulse sequence and determining various parameters including the number of shots, a TR, the number of slices, slice positions, the number of blades and blade positions based on instructing information from the input device 33, and to provide the set imaging condition to the sequence controller control unit 41. For this purpose, the imaging condition setting unit 40 has a function to display screen information for setting an imaging condition on the display unit 34. Especially, by the imaging condition setting unit 40, a blade rotation data acquisition sequence for acquiring data with rotating a zonary region, referred to blade, formed by plural parallel data acquisition loci in the frequency space by every TR can be selected.

The sequence controller control unit 41 has a function to control the driving of the sequence controller 31 by giving the imaging condition including a selected pulse sequence to the sequence controller 31 according to information from the input device 33 or another element. Further, the sequence controller control unit 41 has a function to receive raw data from the sequence controller 31 and arrange the raw data to k-space formed in the k-space database 42. Therefore, the k-space database 42 stores the raw data generated by the receiver 30 as k-space data. That is, k-space data is arranged in k-space formed in the k-space database 42.

The image reconstruction unit 43 has a function to reconstruct image data of the object P which is real space data from k-space data by capturing the k-space data from the k-space database 42 and performing image reconstruction processing including two or three dimensional FT to the k-space data, and to write the reconstructed image data to the image database 44. Therefore, the image database 44 stores the image data reconstructed by the image reconstruction unit 43. Especially, when data is acquired from plural slices, image data is three-dimensional.

The image processing unit 45 has a function to generate two-dimensional image data for displaying by performing image processing such as MIP (Maximum Intensity Projection) processing or MPR (multi-planar reconstruction) processing to image data read from the image database 44, and to display the generated image data for displaying on the display unit 34.

The data correction unit 46 has following functions. It retrieves k space data corresponding to each slice and blade acquired by a blade rotation data acquisition sequence for acquiring k space data so as to be the nonorthogonal state in the k space from the K-space database 42 and calculates motion correction parameters for eliminating an influence of a motion of the object P with respect to each slice and blade. It performs a motion correction on each piece of k space data with the use of the calculated motion correction parameters with respect to each slice and blade. It converts the k space data in the nonorthogonal coordinate system after the motion correction into data in the Cartesian coordinate system and writes the converted data in the K-space database 42. In other words, pieces of k space data within respective blades on a common slice is converted into a single piece of k space data in the Cartesian coordinate system. The image reconstruction unit 43 is configured to retrieve k space data converted into data with respect to each slice in the Cartesian coordinate system after the motion correction for image reconstruction processing.

The data correction unit 46 has a function to recalculate motion correction parameters corresponding to a slice and/or blade designated by instruction from the input device 33 so as to be more appropriate values based on a relationship between the motion correction parameter values and either or both of real space positions where data was acquired and data acquisition times. In this case, while the data correction unit 46 is configured to perform the motion correction of corresponding pieces of k space data again by using the recalculated motion correction parameters, the image reconstruction unit 43 is configured to perform image reconstruction processing again by using k space data after the motion correction using the recalculated motion correction parameters.

Therefore, the correction parameter calculation unit 47 of the data correction unit 46 has a function to calculate motion correction parameters for motion correction based on pieces of k space data corresponding to respective slices and blades retrieved from the K-space database 42.

By the way, since data acquisition times are different among pieces of data acquired from mutually different slices or blades, the pieces of data are influenced due to a motion of the object P in the meantime. Since data acquisition positions differ spatially among pieces of data acquired from mutually different slices, the pieces of data are influenced by motion amounts mutually different depending on spatial positions. Therefore, the values of the motion correction parameters (correction amounts) vary by slice and blade. Consequently, the motion correction parameter is calculated with respect to each slice and blade.

Examples of motion correction parameters include translational correction amounts for correcting positional shifts of image data in the real space due to a translational movement of the object P, rotational correction amounts (phase variation amounts) of k space data in the phase direction of the k space corresponding to the translational correction amounts, rotational correction amounts for correcting positional shifts of image data in the real space due to a rotational movement of the object P, rotational correction amounts of k space data in the k space corresponding to the rotational correction amounts, correlation weight coefficients for weighting to reduce or eliminate contribution degrees of pieces of image data corresponding to slices and/or blades which are not corrected properly even if a motion correction is performed using the rotational correction amounts and/or the translational correction amounts in the real space or the k space, and contribution degrees of spatially positional differences and/or time differences represented as weights of interpolation coefficients like after-mentioned coefficients of an approximate expression to values of motion correction parameters. Correlation weights also become mutually different values by slice and by blade. However, correlation weights generally can be considered as a function with regard to only time since differences in correlation weight between slices often are vanishingly small. Contribution degrees also become mutually different values by slice and by blade. Contribution degrees can be determined based on an integral value or an additional value of absolute values of intensities of echo signals.

A translational correction amount and a rotational correction amount in the real space are calculated with respect to image data that is real space data. Therefore, k space data is converted to pieces of image data corresponding to respective slices and blades by FT once when a translational correction amount and/or a rotational correction amount in the real space are calculated as a motion correction parameter. Then, a piece of image data corresponding to a certain reference blade is selected from respective pieces of image data corresponding to plural blades on a common slice. Moreover, a translational movement and a rotational movement are performed on the other pieces of image data respectively so that displacements of respective pieces of image data corresponding to the other blades with respect to the reference piece of image data become zero. The translational movement amount and the rotational movement amount at this time become the translational correction amount and the rotational correction amount respectively as correction parameters.

The determination of whether each displacement of the respective other pieces of image data with respect to the reference piece of image data becomes zero can be made by examining whether each cross correlation of the respective pieces of image data subjected to the translational movement and the rotational movement with respect to the reference piece of image data is higher, for example. In other words, in case of calculating a translational correction amount, a translational movement of each piece of image data is performed one pixel by one pixel. Then, a distance from the initial position to the position where a cross-correlation with the reference piece of image data becomes higher is the translational correction amount to be obtained as a motion correction parameter. Meanwhile, in case of calculating a rotational correction amount, a rotational movement of pieces of image data is performed one degree by one degree. Then, an angle of rotation from the initial position to the position where a cross-correlation with the reference piece of image data becomes higher is the rotational correction amount to be obtained as a motion correction parameter. Note that, when performing a rotational movement of a piece of image data, pieces of the image data that are not on the data acquisition points are calculated by interpolation.

As described above, calculation of motion correction parameters is separately performed with respect to each slice by a series of processing including selection of the reference piece of image data, translational movements and rotational movements of pieces of image data corresponding to the other blades and the calculation of the correction amounts by cross-correlation processing Meanwhile, a motion correction parameter can be obtained in the k space instead of obtaining a motion correction parameter in the real space. If a motion correction parameter is obtained in the K space, a correction amount with respect to a translational movement of the object P can be obtained with an accuracy higher than that in case of acquiring a motion correction parameter in the real space. In case of obtaining a motion correction parameter in the k space, a motion correction parameter can be obtained by cross-correlation processing as with obtaining a motion correction parameter in the real space. That is, pieces of k space data are rotated with reference to a reference piece of k space data in the phase direction. Then, the phase variation amount when a cross-correlation becomes higher is a motion correction parameter to be obtained with respect to a translational movement of the object P. Further, pieces of k space data are rotated with reference to the reference piece of k space data in the k space. Then, an angle of rotation when a cross-correlation becomes higher is a motion correction parameter to be obtained with respect to a rotational movement of the object P.

Note that, assuming that the object P performs a translational movement only in the x-axis direction in the real space, the phase variation amount in the k space becomes d{arg (Signal)}/dkx by mathematical relation between the real space and the k space when the signal value is represented by Signal.

Moreover as described above, not only these motion correction parameters corresponding to a translational movement and/or a rotational movement of the object P, but also correlation weighting coefficients for weighting to reduce or eliminate contribution degrees of pieces of image data that are not corrected properly even if motion correction is performed using rotational correction amounts and/or translational correction amounts and after-mentioned weights for interpolation coefficients can be obtained as motion correction parameters with respect to each slice and blade.

The motion correction unit 48 has a function to perform motion correction of a piece of k space data with respect to each slice and blade by using motion correction parameters with respect to corresponding slice and blade calculated by the correction parameter calculation unit 47 or recalculated by the correction parameter recalculation unit 50 to be described. This means the motion correction unit 48 retrieves a piece of k space data with respect to each slice and blade from the K-space database 42.

When a motion correction parameter is a parameter in the real space, the motion correction unit 48 temporarily converts pieces of k space data into pieces of image data corresponding to respective slices and blades by FT. Subsequently, the motion correction unit 48 translates and rotates the pieces of image data corresponding to the respective slices and blades by the corresponding translational movement amount and rotational movement amount. Thereby displacements among the respective pieces of image data from the respective slices and blades due to the rotational and translational motion of the object P are canceled. Then, the pieces of image data after the motion correction are converted again to pieces of k space data after the motion correction corresponding to the respective slices and blades by inverse FT.

Meanwhile, when a motion correction parameter is a parameter in the k space, the motion correction unit 48 changes each phase and angle of rotation of pieces of k space data corresponding to the respective slices and blades by the corresponding phase variation amounts and rotational correction amounts respectively. Thereby phase shifts and displacements among the respective pieces of k space data from the respective slices and blades due to the rotational and translational motion of the object P are canceled.

Moreover, when correlation weighting coefficients for weighting processing have seen obtained as motion correction parameters, by using the correlation weighting coefficients with respect to the respective slices and blades, weighting processing of the pieces of k space data or the pieces of image data after FT corresponding to the respective slices and blades is performed by the motion correction unit 48.

The coordinate conversion unit 49 has a function to generate k space data in the Cartesian coordinate system per slice by performing gridding processing using the pieces of K space data after the motion correction, corresponding to the respective slices and blades, and obtained from the motion correction unit 48 and to write the generated k space data in the Cartesian coordinate system in the K-space database 42. That is, since k space data after the motion correction by the motion correction unit 48 is radial data in the nonorthogonal coordinate system, it is converted to data in the Cartesian coordinate system by the coordinate conversion unit 49. To this purpose, values on data points in the Cartesian coordinate system are obtained by interpolation processing using values on data points in the nonorthogonal coordinate system.

The correction parameter recalculation unit 50 has a function to recalculate motion correction parameters corresponding to the slices and/or blades designated by the instruction from the input device 33 among respective motion correction parameters corresponding to the multiple slices and blades obtained by the correction parameter calculation unit 47 so that each motion correction parameter becomes a more appropriate value based on a relationship between the motion correction parameter values and either or both of the real space positions where data was acquired and the data acquisition times.

This means, when a value of a single motion correction parameter or plural motion correction parameters corresponding to a single slice and blade or multiple slices and blades is abnormal value without being calculated as an appropriate value by the correction parameter calculation unit 47, information designating motion correction parameters to be recalculated can be provided from the input device 33 to the correction parameter recalculation unit 50 so that the designated motion correction parameters are recalculated in the correction parameter recalculation unit 50.

The recalculation of a motion correction parameter can be performed based on relations among plural motion correction parameter values and either or both of a real space position of the object P and a data acquisition time where and when the k space data on slice and blade corresponding to a motion correction parameter to be recalculated was acquired. That is, a value of a motion correction parameter changes smooth depending on the change of the data acquisition time. Similarly, a value of a motion correction parameter also changes smooth depending on the change of the real space position of data acquisition. Therefore, if mathematization is performed on either or both of the data acquisition time dependence and the spatial positional dependence of a motion correction parameter value to obtain an approximation expression or approximation expressions, a value of motion correction parameter can be recalculated so as to become an appropriate value by using an approximation expression to be corrected. Then, all of the motion correction parameter values become normal if each motion correction parameter showing an abnormal value is eliminated and a part where values do not exist is interpolated using the recalculated motion correction parameters.

Figure 5:
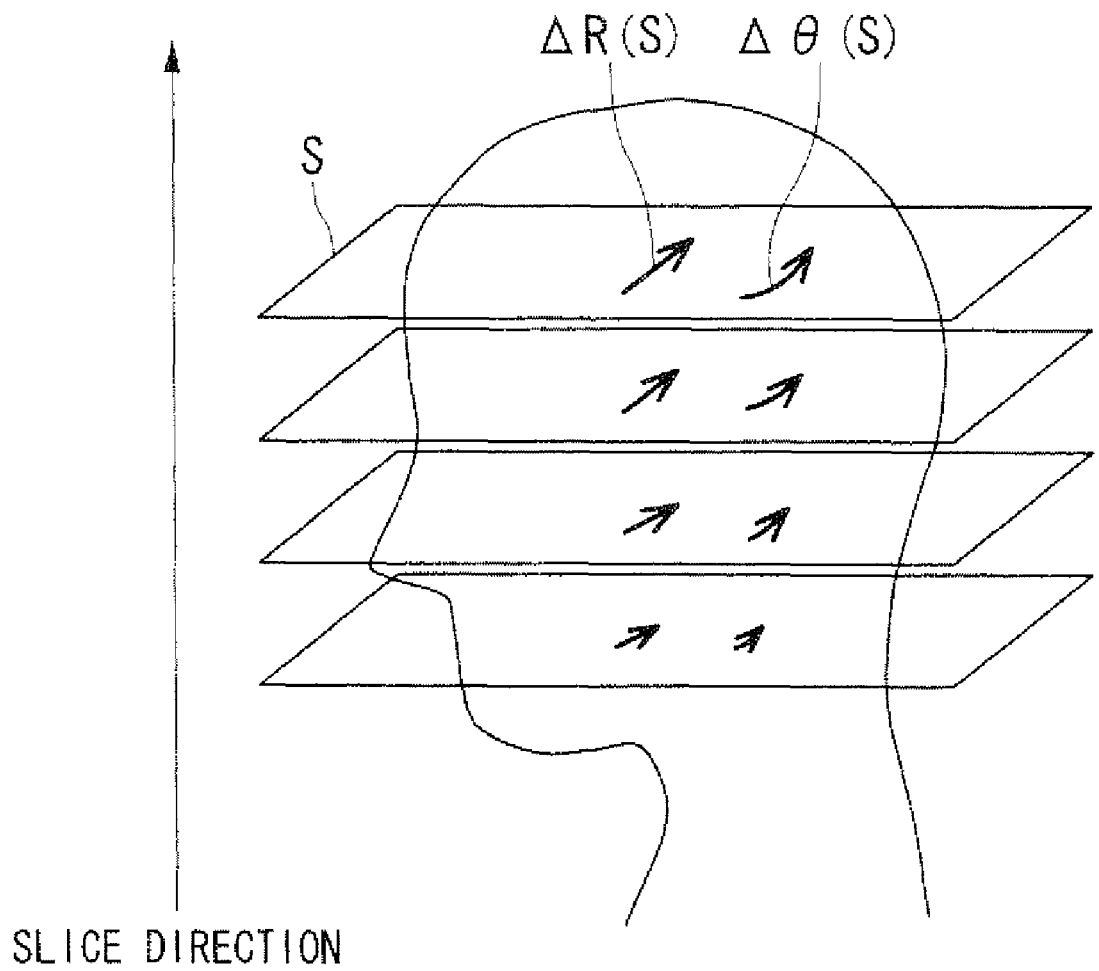
FIG. 5 is a diagram showing an example of correction vectors ΔR each representing a translational movement amount and rotation angles Δθ representing rotational movement amount on plural slices set in a head part of an object along the body axis.

FIG. 5 is a diagram showing an example of correction vectors ΔR each representing a translational movement amount and rotation angles AG representing rotational movement amount on plural slices set in a head part of an object along the body axis.

As shown in FIG. 5, when multiple slices are set along the body axis direction in the head part of the object P, from the point of view in the real space, a motion correction parameter such as the translational correction amount ΔR and the rotational correction amount Δθ varies by slice S since data acquisition positions differ spatially among slices. However, when the object P is considered to be a rigid body, both of a translational movement and a rotational movement of a motion of the object P become linear motions. Therefore, assuming that there is no rapid motion of the object P in 1 TR when pieces of k space data are respectively acquired from corresponding multiple blades on different slices S, it can be considered that a translational correction amount ΔR and a rotational correction amount Δθ also change linearly depending on a position in the slice direction.

As an actual example, as for imaging a head with setting a single slab, a linear motion of the object P with respect to a vector in the slice direction is normally dominant in both the translational and rotational movement.

Therefore, a linear approximation can be performed on an amount of change of a motion correction parameter, such as a translational correction amount, a rotational correction amount and/or a phase variation amount and/or a rotational correction amount of k space data, due to the change of spatial position in the slice direction.

Note that, although a linear approximation can be also performed on an amount of change of a correlation weighting coefficient for weighting processing due to the change of spatial position in the slice direction, an amount of change of the weighting coefficient due to a spatial position change is considered to be negligible in general. This means, generally, when a correlation weighting coefficient is assumed to be W(S, B) and a spatial position in the slice direction is assumed to be z, δ W(S(z), B)/δz≈0 can be assumed.

When a motion correction parameter, corresponding to the slice Sp and the blade Bp, to be calculated is assumed to be M(Sp, Bp), the expression to recalculate the motion correction parameter M(Sp, Bp) by a linear approximation can be expressed as the expression (1).

$$M(Sp, Bp) = a1 \times Sp + a2 \quad (1)$$

In the expression (1), a1 and a2 represent coefficients of the linear approximation expression. These coefficients a1 and a2 can be obtained from plural known motion correction parameters M(S, B) corresponding to arbitrary slices S and arbitrary blades B within a range within which the linear approximation is formed. That is, the coefficients a1 and a2 can be calculated based on plural motion correction parameters M(S, B) by the expression (2).

$$M(S, B) = a1 \times S + a2 \quad (2)$$

As shown in the expression (2), since the number of the unknown coefficients a1 and a2 is two in the case of a linear approximation, at least two known motion correction parameters M(S, B) are necessary to obtain the coefficients a1 and a2. Since the motion correction parameter M(S, B) is also a function of a blade B, the coefficients a1 and a2 are also determined with respect to each blade. Consequently, the expression (1) is rewritten into the expression (3).

$$M(Sp, Bp) = a1(Bp) \times Sp + a2(Bp) \quad (3)$$

In case of calculating the coefficients a1 and a2 by using three motion correction parameters M(S, B) and over, the coefficients a1 and a2 can be calculated by the least squares method or another known approximation method. Therefore, as far as within a range in which a linear approximation is formed, obtaining the coefficients a1 and a2 by using more motion correction parameters N(S, B) leads to improve accuracies of the coefficients a1 and a2 and the motion correction parameter M(Sp, Bp) to be obtained.

The number of slices in a slab is normally 30 at the most and around 20 to 24 as for imaging a head part. Therefore, when the object P is considered to be a rigid body like a head part, a linear approximation is sufficiently formed within an imaging area in the slice direction. Therefore, any motion correction parameter M(S, B) corresponding to every slice can also be used for calculation of the coefficients a1 and a2. However, since an amount of change of the motion correction parameter M(S, B) due to time change is assumed to be zero, it is preferable to use a motion correction parameter M(S, B) corresponding to the same time phase.

Moreover, although a case where a motion of the object P is negligible among data acquisition times of k space data has been described, a motion correction parameter M(Sp, Bp) can also be recalculated in consideration of a motion of the object P among data acquisition times. In that case, a relation between a temporal motion amount of the object and an amount of change of a motion correction parameter M(S, B) is to be used. That is, by using not only a spatial position term (a1×S÷a2) representing a change of a motion correction parameter M(S, B) due to positional differences among slices in the real space, but also a time term representing a change of the motion correction parameter M(S, B) due to a change of data acquisition time, the motion correction parameters M(S, B) need to be approximated.

Figure 6:
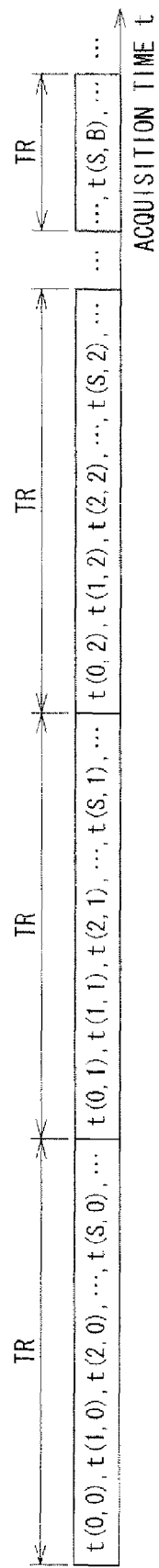
FIG. 6 is a diagram showing time series pieces of k-space data, aligned in time direction, acquired by a blade rotation data acquisition sequence.

FIG. 6 is a diagram showing time series pieces of k-space data, aligned in time direction, acquired by a blade rotation data acquisition sequence.

In FIG. 6, the abscissa denotes acquisition time of k-space data and t(S, B) represents an acquisition time of k-space data in a certain blade on a certain slice. An acquisition time of data from a certain blade is often considered as an acquisition time of data of the center of k-space in the blade, i.e., TE (echo time).

As shown in FIG. 6, pieces of k space data are sequentially acquired from respective blades B=1 on different slices (S=0, 1, 2, ...) in the first 1 TR. In the next 1 TR, pieces of k space data are sequentially acquired from respective blades B=2 on the different slices (S=0, 1, 2, ...). In this way, pieces of k space data are sequentially acquired from corresponding blades B on different slices S in 1 TR and pieces of k space data are sequentially acquired from other respective blades B in the next 1 TR. By repeating data acquisition in 1 TR by the number of the blades B, k space data necessary for image reconstruction is acquired and filled in the k space.

As described above, since data acquisition times t(S, B) differ mutually if slices and blades differ mutually, a value of a motion correction parameter also changes with a change of a data acquisition time t(S, B) in addition to a change of a spatial position in the slice direction.

When a real space position of slice S is set to z(S) here, a linear approximation can be performed on an amount of change of a motion correction parameter M(S, B) due to a change of a spatial position z(S) since the object P is considered to be a rigid body as described above. Meanwhile, a high-order approximation of an arbitrary order can be performed on an amount of change of the motion correction parameter M(S, B) due to a change of a data acquisition time t(S, B). In terms of usefulness and simplification of processing, a case of performing the quadratic approximation on an amount of change of the motion correction parameter M(S, B) with a change of the data acquisition time t(S, B) is described here.

In this case, the motion correction parameter M(S, B) can be expressed as a function M1(z(S), t(S, B)) with regard to a spatial position z(S) and a data acquisition time t(S, B) like the expression (4).

$$M(S,B) = M1(z(S), t(S,B)) \quad (4)$$

Note that, a motion correction parameter M1(z(S), t(S, B)) that can be used for a Quadratic approximation is a motion correction parameter M1(z(Si), t(Si, Bi)) (i=0, 1, 2, ..., N) close to the motion correction parameter M1(z(Sp), t(Sp, Bp)) to be recalculated in the data acquisition time t(S, B) and within a time range where the quadratic approximation is sufficiently formed.

When a difference between a real space position zp of the slice Sp of the motion correction parameter M1(z(Sp), t(Sp, Bp))=M1 (zp, tp) to be recalculated and a real space position zi of the slice Si of each motion correction parameter M1(z (Si), t (Si, Bi))=M1(zi, ti) for a quadratic approximation is denoted by $\Delta z_i$, and a difference between a data acquisition time tp of the motion correction parameter M1(zp, tp) to be recalculated and a data acquisition time ti of each motion correction parameter M1(zi, ti) for the quadratic approximation is denoted by $\Delta t_i$, the next expression (5) is mathematically formed.

$$\begin{aligned} M(zp + \Delta z_i, tp + \Delta t_i) = &\ M(zp, tp) \\ &+ \partial M / \partial z_{z=zp} \times \Delta z_i + \partial M / \partial t_{t=tp} \times \Delta t_i \\ &+ \partial^2 M / \partial z \partial t_{t=tp, z=zp} \times \Delta z_i \times \Delta t_i + \\ &\ 1/2 \times \partial^2 M / \partial t^2_{t=tp} \times (\Delta t_i)^2 \\ &(i = 0, 1, 2, \ldots, N) \end{aligned} \quad (5)$$

From the expressions (4) and (5), the motion correction parameter M(Sp, Bp) to be recalculated can be calculated by the expression (6).

$$M(Sp,Bp) = M1(z(Sp), t(Sp,Bp)) = M1(zp,tp) = b1 \cdot tp^2 + b2 \cdot tp \cdot zp + b3 \cdot tp + b4 \cdot zp + b5 \quad (6)$$

This means, as shown in the expressions (5) and (6), in the expressions for calculating the motion correction parameter M1(zp, tp), the term with the spatial position zp of a slice as a parameter is a linear expression where the second or more order partial differential value is considered to be zero since the object P is assumed to be a rigid body. And the term with the data acquisition time tp as a parameter is a quadratic expression where the third or more order partial differential value is considered to be zero.

Since there are 5 unknown coefficients b1, b2, b3, b4 and b5 in the expression (6), all the coefficients b1, b2, b3, b4 and b5 can be calculated by using at least temporally adjacent 5 motion correction parameters M1(zi, ti) (i=1, 2, 3, ..., N; N≧5). In case of obtaining coefficients b1, b2, b3, b4 and b5 by using temporally adjacent 6 and more motion correction parameters M1(zi, ti), they can be obtained by an optimization algorithm under the least-square method or another known approximation method. Therefore, if the number of temporally adjacent motion correction parameters M1(zi, ti)

for obtaining coefficients b1, b2, b3, b4 and b5 increases, the approximation accuracy improves. On the contrary, there is a possibility that the quadratic approximation is not formed when motion correction parameters M1(zi, ti) for obtaining coefficients b1, b2, b3, b4 and b5 are temporally separated too much from the motion correction parameter M1(zp, tp) to be calculated. Therefore, depending on these properties, it is preferable to use an adequate number of the notion correction parameters M1 (zi, ti) temporally adjacent to the motion correction parameter M1(zp, tp) to be calculated for calculating the coefficients b1, b2, b3, b4 and b5.

Then, a value of the motion correction parameter M1(zp, tp) to be calculated can be calculated and Interpolated by the expression (6) using the obtained 5 coefficients b1, b2, b3, b4 and b5.

Note that, in case of considering a time change of the motion correction parameters M1(zi, ti), the foregoing correlation weighting coefficient W for weighting processing may vary temporally. In other words, δW/δt≠0. Therefore, the correlation weighting coefficient W(zp, tp)=W(Sp, Bp) may be a target for recalculation.

In an example of the approximation expression shown in the expression (6), although a quadratic approximation is used with regard to the data acquisition time t and a linear approximation is used with regard to the real space position z of data acquisition, a higher-order approximation can be used as described above. In such a case, since unknowns increase depending on an approximation order, temporally adjacent motion correction parameters M1(zi, ti) whose the number is not lower than the number of the unknowns are used for calculation of the unknowns. Especially, when a target to be imaged is a nonrigid body Like an organ, using a quadratic or higher-order approximation with regard to the real space position z of data acquisition makes it possible to perform a motion correction of a nonrigid body.

In addition, weights for interpolation coefficients such as coefficients for $\Delta t_i$ and/or $\Delta z_i$ in the expression (5) may be set as contribution degrees of the real space position z and/or the data acquisition time t, and also considered as the above-mentioned motion correction parameters for respective slices and respective blades.

In this way, the motion correction unit 48 is configured to perform the motion correction of corresponding pieces of k space data by using motion correction parameters recalculated by the correction parameter recalculation unit 50. Further, the coordinate conversion unit 49 is configured to convert k space data after the motion correction into k space data in the Cartesian coordinate system. The image reconstruction unit 43 is configured to perform again image reconstruction processing of k space data after the motion correction using the recalculated motion correction parameters.

Moreover, determination of motion correction parameters to be recalculated by the correction parameter recalculation unit 50 can be performed automatically without instructions from a user.

The recalculation target data determining unit 51 has a function to acquire respective motion correction parameters corresponding to plural slices and blades from the correction parameter calculation unit 47, determine notion correction parameters to be recalculated by error detection processing for determining whether each of the acquired motion correction parameters is a singular value or not, and inform identification information of the determined motion correction parameters of the correction parameter recalculation unit 50. Error detection processing determining whether each motion correction parameter is a singular value or not can be performed by processing determining whether a difference value or a ratio between a motion correction parameter before recalculation calculated by the correction parameter calculation unit 47 and an approximate value serving as the above-mentioned reference value of the corresponding motion correction parameter is within a range defined by predetermined thresholds or not.

The correction parameter recalculation unit 50 is configured to perform recalculation of motion correction parameters corresponding to identification information of motion correction parameters to be recalculated by interpolation as described above when the correction parameter recalculation unit 50 receives the identification information from the recalculation target data determining unit 51. In other words, the recalculation target data determining unit 51 has a function to determine adoption and rejection of pieces of data to be relocated in the k space.

Then, the operation and action of a magnetic resonance imaging apparatus 20 will be described.

Figure 7:
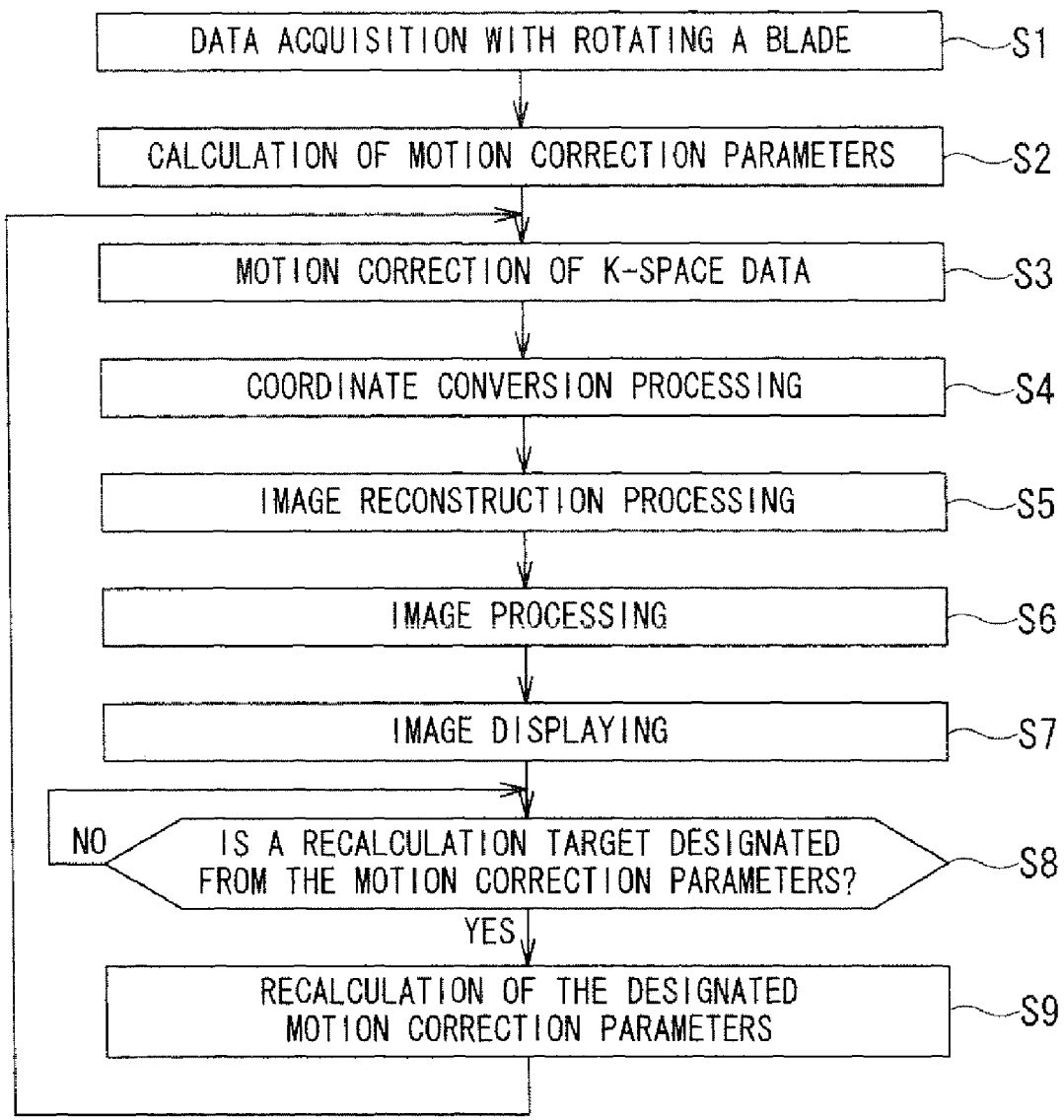
FIG. 7 is a flowchart showing a procedure for acquiring data from the object using a blade rotation data acquisition sequence and reconstructing an image of the object with motion correction regarding the object to the acquired data by the magnetic resonance imaging apparatus shown in FIG. 3.

FIG. 7 is a flowchart showing a procedure for acquiring data from the object P using a blade rotation data acquisition sequence and reconstructing an image of the object P with motion correction regarding the object P to the acquired data by the magnetic resonance imaging apparatus 20 shown in FIG. 3. The symbols each including S with a number in FIG. 7 indicate each step of the flowchart.

Consequently, the RF coil 24 receives NMR signals generated due to nuclear magnetic resonance in the object P. Then, the receiver 30 receives the NMR signals from the RF coil 24 and generates raw data which is digital data of NMR signals by A/D conversion subsequently to necessary signal processing. The receiver 30 supplies the generated raw data to the sequence controller 31. The sequence controller 31 supplies the raw data to the sequence controller control unit 41. The sequence controller control unit 41 arranges the raw data as k-space data to k space formed in the k-space database 42.

Precedently, the object P is set to the bed 37, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

Then, in step S1, data acquisition is performed according to the blade rotation data acquisition sequence with rotating a blade in k-space. That is, when selection information of the blade rotation data acquisition sequence is imputed together with various parameters including the number of shots, a TR, the number of slices, slice positions, the number of blades and blade positions as information for setting imaging conditions from the input device 33 to an imaging condition setting unit 40, the imaging condition setting unit 40 sets an imaging condition according to information from the input device 33. Subsequently, the input device 33 sends instruction of starting data acquisition to the sequence controller control unit 41. Then, the sequence controller control unit 41 supplies the blade rotation data acquisition sequence received from the imaging condition setting unit 40 to the sequence controller 31. Therefore, the sequence controller 31 drives the gradient power supply 27, the transmitter 29, and the receiver 30 in accordance with the blade rotation data acquisition sequence received from the sequence controller control unit 41, thereby generating a gradient magnetic field at the imaging area having the set object P, and further generating RE signals from the RF coil 24.

Since the pieces of k space data are acquired by the blade rotation data acquisition sequence, each piece of the k space data becomes slice-by-slice and blade-by-blade data. Since each piece of the k space data is influenced by the motion of the object P, a motion correction needs to be performed to eliminate the influence of the motion from each piece of the data. This motion correction of the pieces of k space data is performed in the data correction unit 46.

Therefore in step S2, motion correction parameters for the motion correction are calculated by the correction parameter calculation unit 47. Specifically, the correction parameter calculation unit 47 determines a reference piece of data corresponding to each slice out of the pieces of k space data or the pieces of image data obtained by FT of the pieces of k space data, corresponding to the respective slices and blades, retrieved from the K-space database 42 as described above. Then, the correction parameter calculation unit 47 performs translational movements (or phase rotations) and/or rotational movements of the pieces of data from the other blades so that each cross-correlation coefficient with respect to the reference piece of the data becomes larger. This can calculate translational movement amounts and rotational movement amounts in the real space or phase variation amounts and rotational movement amounts in the k space to correct the motion with the translational movement and the rotational movement of the object P as motion correction parameters.

Moreover, in case of performing weighting processing of the pieces of data corresponding to the respective slices and the respective blades, correlation weighting coefficients corresponding to the respective slices and blades necessary for the weighting processing also can be calculated as motion correction parameters by a known method.

Subsequently in the step S3, the motion correction unit 48 performs the motion corrections of the pieces of k space data in the respective slices and blades by using the motion correction parameters corresponding to the respective slices and blades calculated by the correction parameter calculation unit 47. Specifically, the motion correction unit 48 performs phase rotations and rotational movements of the pieces of k space data corresponding to the respective slices and blades by the phase variation amounts and the rotational correction amounts respectively when the pieces of k space data are directly set as targets of the motion corrections. When the pieces of image data are set as targets of the motion corrections, the motion correction unit 48 performs translational movements and rotational movements of the pieces of image data by the translational correction amounts and the rotational correction amounts respectively.

Moreover, when the correlation weighting coefficients for the weighting processing have been calculated as motion correction parameters, the weighting processing using the correlation weighting coefficients is performed on the pieces of k space data or the pieces of image data corresponding to the respective slices and blades.

Subsequently in step S4, the coordinate conversion unit 49 generates a piece of k space data in the Cartesian coordinate system per slice by gridding processing of the pieces of k space data, corresponding to the respective slices and blades, after the motion corrections, and received from the motion correction unit 48, and writes the generated pieces of k space data in the Cartesian coordinate system in the K-space database 42.

Subsequently, in step S5, the image reconstruction unit 44 reads the k-space data, having been subjected to the motion correction, in Cartesian coordinate system from the k-space database 42 and performs image reconstruction processing including two or three dimensional FT to the read k-space data, thereby reconstructing image data of the object P which is real space data. The reconstructed image data is written in the image database 44.

Since the image data here is generated from the k space data acquired from multi slices, it becomes three-dimensional data. Therefore, it is necessary to generate two-dimensional image data for displaying based on the three-dimensional image data to display an image of the object P on the display unit 34.

Accordingly, in step S6, the image processing unit 45 reads the three-dimensional image data form the image database 44 and performs image processing such as MIP processing or MPR processing, thereby generating two-dimensional image data for displaying.

Subsequently, in step S7, the image processing unit 45 displays the generated image data for displaying on the display unit 34. Consequently, the display unit 34 displays an image, having been subjected to the motion correction using the motion correction parameters, of the object P.

However, a motion correction parameter calculated by the correction parameter calculation unit 47 might become an abnormal value. In this case, if the motion correction of k space data is performed by using the motion correction parameter showing the abnormal value without correction and an image is reconstructed, an artifact occurs on the image. Since data acquired especially from a parietal region has a high isotropy in a rotational direction, it is highly possible that a rotational correction amount in the real space and a phase variation amount in the k space become abnormal values. And it has been known that an artifact called Crinkling occurs due to an isotropy of a parietal region in a rotational direction.

Therefore, multiple images corresponding to the respective slices displayed on the display unit 34 may include a slice image where an artifact occurs. Therefore, a user selects a single slice image or multiple slice images where an artifact occurs from the images displayed on the display unit 34 by operating the input device 33 to provide instructions to the computer 32.

In addition, recalculation instruction of the motion correction parameters corresponding to the selected slice images is input into the computer 32 by operating the input device 33. This recalculation instruction of the motion correction parameters can be performed, for example, by displaying a recalculation instruction button on the display unit 34 with GUI (Graphical User Interface) technique and clicking with the input device 33 such as a mouse. Alternatively, a hardware key for recalculation instruction may be equipped on an operation panel of the magnetic resonance imaging apparatus 20.

When selection information of slice images and recalculation instruction of motion correction parameters are input into the computer 32 from the input device 33, in step S8 the correction parameter recalculation unit 50 of the data correction unit 46 determines that recalculation instruction of motion correction parameters is inputted.

Then in step S9, the correction parameter recalculation unit 50 recalculates the motion correction parameters designated by selecting the slice images. Specifically, the correction parameter recalculation unit 50 recalculates the motion correction parameter(s) corresponding to the selected single slice or multiple slices by the above-mentioned approximation, based on a relation between motion correction parameter values and either or both of real space positions of the respective slices and data acquisition times, with using mot on correction parameters corresponding to plural slices other than the selected slice(s). Consequently, the motion correction parameters having abnormal values are eliminated and the motion correction parameters corresponding to the blank slices are interpolated based on the motion correction parameters corresponding to other slices. That is, the motion correction parameters having abnormal values are corrected to normal values.

Motion corrections are performed again in step S3 by using the recalculated motion correction parameters, and images are displayed in step S7 through the processes from step S4 to step S6.

Since the motion corrections has been performed on the displayed images using the motion correction parameters recalculated as appropriate values, artifacts caused by abnormality of motion correction parameters are eliminated or at least reduced. In consideration of the convenience of a user, a message or a mark such as a flag indicating that a motion correction parameter was recalculated can be displayed adjacent to a slice image obtained with recalculation of the motion correction parameter. In that case, identification information of slice images obtained with the recalculation of a motion correction parameter should be notified from the correction parameter recalculation unit 50 to the image processing unit 45.

By the way, though an example of manually designating recalculation targets of motion correction parameters with operation of the input device 33 by a user is described in the flowchart shown in FIG. 7, recalculation targets of motion correction parameters can be determined automatically.

Figure 8:
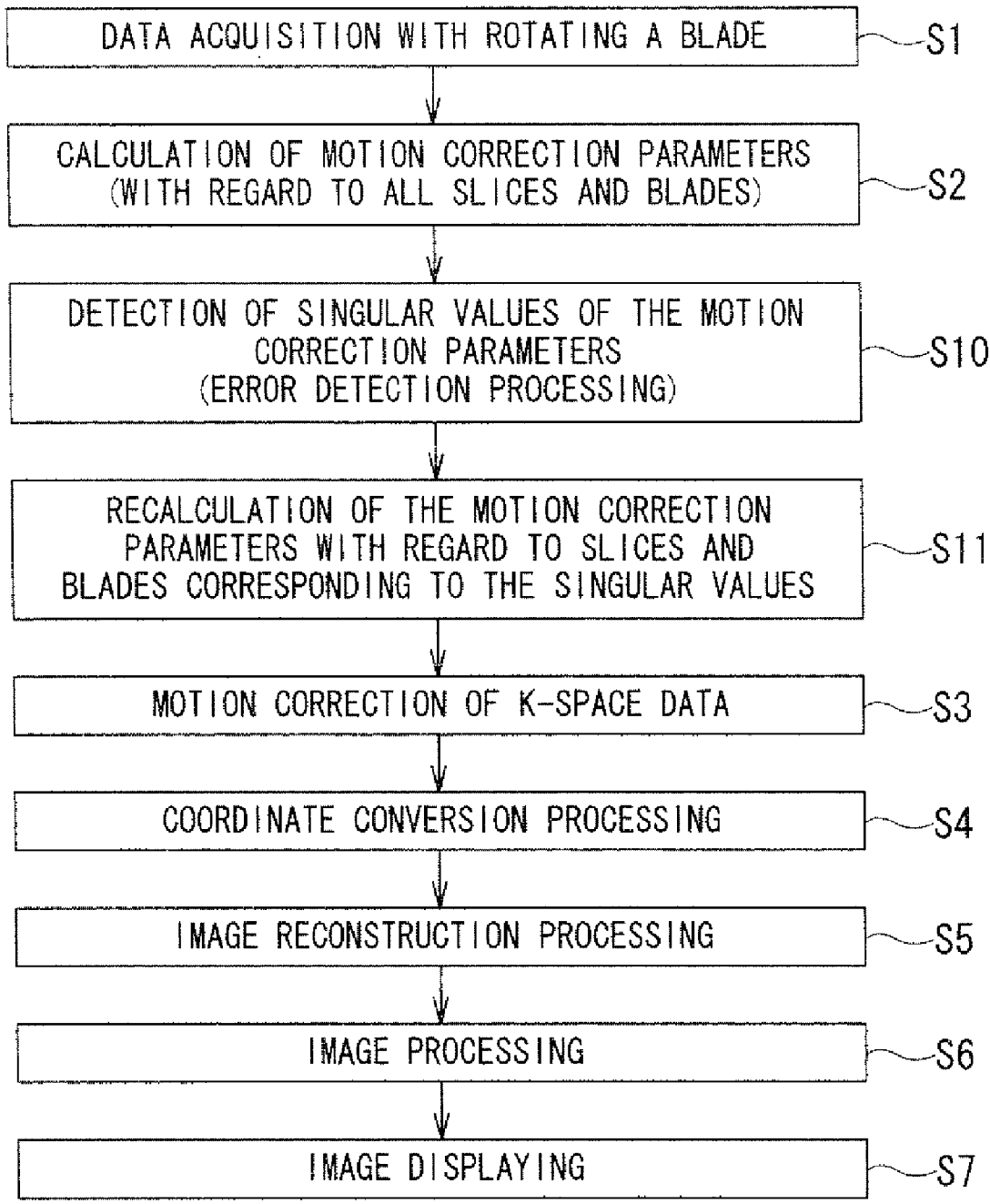
FIG. 8 is a flowchart showing a procedure in case of performing motion correction with automatically determining recalculation target of motion correction parameters by the magnetic resonance imaging apparatus shown in FIG. 3.

FIG. 8 is a flowchart showing a procedure in case of performing motion correction with automatically determining recalculation target of motion correction parameters by the magnetic resonance imaging apparatus 20 shown in FIG. 3. The symbols each including S with a number in FIG. 8 indicate each step of the flowchart. Note that, description of a step equivalent to one in FIG. 7 is omitted with attaching the same symbol as that in FIG. 7 to the step.

When recalculation targets of motion correction parameters is determined automatically, in step 10, the recalculation target data determining unit 51 acquires plural motion correction parameters corresponding to the all slices and all blades from the correction parameter calculation unit 47 and performs error detection processing to determine whether each of the acquired motion correction parameters is a singular value or not. Then, the recalculation target data determining unit 51 informs slices and blades corresponding to motion correction parameters, whose values are determined to be singular values, of the correction parameter recalculation unit 50.

Subsequently in step S11, the correction parameter recalculation unit 50 recalculates the motion correction parameters, each showing a singular value, with regard to the slices and the blades which are informed from the recalculation target data determining unit 51.

Subsequently, through a procedure equivalent to that of the flowchart shown in FIG. 7, images after motion corrections are displayed. Note that, though an example of automatically recalculating the motion correction parameters corresponding to all slices is shown in FIG. 8, plural slice images obtained without recalculation of motion correction parameters once may be displayed so that a user can designate whether automatically determining blades corresponding to motion correction parameters to be recalculated is performed or not with regard to each slice.

In addition, displaying an identification mark such as a flag together with each slice image generated with recalculation of motion correction parameter improves convenience of a user. Further, in case where the recalculation target data determining unit 51 determined that recalculation of a motion correction parameter is necessary, displaying an identification mark such as a flag together with each slice image generated with using a motion correction parameter before recalculation once and displaying each slice image generated with using the motion correction parameter after recalculation in response to instructions to recalculate the motion correction parameter from a user also improves convenience of a user.

As described above, the magnetic resonance imaging apparatus 20$s$ an apparatus which can recalculate correction amounts corresponding to respective slices and blades based on spatial positional relationship among data acquisition points and/or data acquisition times in order to improve reliability in motion corrections of an object to pieces of data acquired with respect to respective slices and blades in the nonorthogonal state in the k space by a blade rotation data acquisition sequence. That is, according to the magnetic resonance imaging apparatus 20, a motion correction amount corresponding to an arbitrary slice and blade can be calculated by interpolation based on motion correction amounts corresponding to other slices and blades.

Consequently, according to the magnetic resonance imaging apparatus 20, even when a motion correction parameter is acquired as an abnormal value or with an inadequate accuracy, the motion correction parameter can be corrected to an appropriate value. Specifically, the motion correction amount showing an abnormal value can be calculated by interpolation based on spatially and/or temporally different other motion correction amounts, preferably based on other motion correction amounts corresponding to adjacent pieces of data.

Consequently, as a concrete example, even when it is difficult to calculate a rotational correction amount due to a rotation of a parietal region with a satisfactory accuracy, an occurrence probability of correction errors can be reduced since the rotational correction amount can be calculated by interpolation based on rotational correction amounts corresponding to pieces of data from other slices and/or blades.

As described above, according to the magnetic resonance imaging apparatus 20, a motion correction based on a motion correction amount showing an abnormal value or with an inadequate accuracy is avoided, and therefore, an artifact caused by a motion correction amount showing an abnormal value or with an inadequate accuracy can be suppressed and a frequency of occurrence of the artifact can be reduced. Accordingly, according to the magnetic resonance imaging apparatus 20, stable motion correction can be guaranteed.

Meanwhile, though the foregoing embodiment explains an example where the designated motion correction parameters are recalculated by approximation based on other motion correction parameters, all the motion correction parameters may be corrected by approximation regardless of whether a motion correction parameter is abnormal. However in that case, since a value of motion correction parameter that is originally normal and not necessary to be corrected changes, the configuration of the foregoing embodiment is probably preferable in case where a motion correction parameter that is not abnormal can be obtained with a satisfactory accuracy.

What is claimed is:

1. A magnetic resonance imaging apparatus comprising:
   a data acquisition unit configured to acquire data based on nuclear magnetic resonance from plural slices in an object by rotating a zonary region formed by plural parallel data acquisition loci in frequency space by every repetition time;
   a correction parameter calculation unit configured to calculate correction parameters for motion correction with regard to the object of the data;
   a correction parameter recalculation unit configured to recalculate at least a part of the correction parameters based on relationship between values of the correction parameters and at least one of real-spatial positions and times at which the data is acquired;

a data correction unit configured to correct the data using correction parameters including correction parameters recalculated by said correction parameter recalculation unit; and a image data generating unit configured to generate image data based on data corrected by said data correction unit.

2. A magnetic resonance imaging apparatus of claim 1, wherein said correction parameter recalculation unit is configured to calculate an approximate expression representing the relationship to recalculate at least the part of the correction parameters using the approximate expression.

3. A magnetic resonance imaging apparatus of claim 2, wherein said correction parameter recalculation unit is configured to calculate the approximate expression by an interpolation using at least a part of the correction parameters before recalculation.

4. A magnetic resonance imaging apparatus of claim 2, wherein said correction parameter recalculation unit is configured to calculate the approximate expression by least-square-fitting using at least a part of the correction parameters before recalculation.

5. A magnetic resonance imaging apparatus of claim 2, wherein said correction parameter recalculation unit is configured to calculate the approximate expression including at least one of a linear expression having a parameter representing a spatial position at which the data is acquired and a quadratic expression having a parameter representing a time at which the data is acquired as a term is calculated.

6. A magnetic resonance imaging apparatus of claim 1, wherein said correction parameter calculation unit is configured to calculate at least one of translational amounts in a real space due to a translational movement of the object, rotational amounts in the real space due to a rotational movement of the object, phase variation amounts in the frequency space corresponding to the translational amounts in the real space, rotational amounts in the frequency space corresponding to the rotational amounts in the real space, correlation weights used for weighting the data and weights for interpolation coefficients used for recalculation of at least the part of the correction parameters as the correction parameters.

7. A magnetic resonance imaging apparatus comprising:
a static magnetic field generation unit configured to apply a static magnetic field to an object;
a gradient magnetic field generation unit configured to apply a gradient magnetic field to the object;
a radio frequency magnetic field generation unit configured to expose a radio frequency magnetic field pulse inducing a nuclear magnetic resonance to nuclear spins in the object;
an echo signal detection unit configured to detect echo signals emitted due to the nuclear magnetic resonance;
a control unit configured to control said gradient magnetic field generation unit, said radio frequency magnetic field generation unit and said echo signal detection unit so as to perform an operation by every repetition time with regard to each of plural blades declining at mutually different angles, the operation being to acquire echo signals for one blade having plural parallel data acquisition loci, in a frequency space in which data of the echo signals is arranged, of which one locus passes an original point in the frequency space within the repetition time;

a calculation unit configured to calculate correction parameters for motion correction of respective pieces of data in plural blades based on correlation information with regard to the plural blades;

a correction unit configured to correct the respective pieces of the data in the plural blades based on the correction parameters; and an image reconstruction unit configured to relocate data corrected by said correction unit in the frequency space and reconstruct an image with Fourier transformation based on the corrected data.

8. A magnetic resonance imaging apparatus of claim 7, wherein said calculation unit is configured to reconstruct the pieces of the data in the plural blades respectively, calculate first correction parameters for the respective blades so as to raise a cross correlation of pieces of reconstructed data respectively corresponding to the plural blades or based on a relationship between reconstructed data corresponding to a reference blade and reconstructed data corresponding to each blade and calculate second correction parameters from the first correction parameters based on information with regard to at least one of real-spatial positions and times at which the pieces of the data in the plural blades are acquired.

9. A magnetic resonance imaging apparatus of claim 7, further comprising:
a determining unit configured to determine adoption and rejection of data to be relocated in the frequency space based on the correlation information with regard to the plural blades.

10. A magnetic resonance imaging apparatus of claim 7, further comprising:
a weighting unit configured to weight the corrected data to be relocated in the frequency space using weight coefficients based on the correlation information with regard to the plural blades.

11. A magnetic resonance imaging method comprising:
acquiring data based on nuclear magnetic resonance from plural slices in an object by rotating a zonary region formed by plural parallel data acquisition loci in frequency space by every repetition time;
calculating correction parameters for motion correction with regard to the object of the data;
recalculating at least a part of the correction parameters based on relationship between values of the correction parameters and at least one of real-spatial positions and times at which the data is acquired;
correcting the data using correction parameters including the recalculated correction parameters; and
generating image data based on the corrected data.

12. A magnetic resonance imaging method of claim 11, wherein an approximate expression representing the relationship is calculated to recalculate at least the part of the correction parameters using the approximate expression.

13. A magnetic resonance imaging method of claim 12, wherein the approximate expression is calculated by an interpolation using at least a part of the correction parameters before recalculation.

14. A magnetic resonance imaging method of claim 12, wherein the approximate expression is calculated by least-square-fitting using at least a part of the correction parameters before recalculation.

15. A magnetic resonance imaging method of claim 12, wherein the approximate expression including at least one of a linear expression having a parameter representing a spatial position at which the data is acquired and a quadratic expression having a parameter representing a time at which the data is acquired as a term is calculated.

16. A magnetic resonance imaging method of claim 11, wherein at least one of translational amounts in a real space due to a translational movement of the object, rotational amounts in the real space due to a rotational movement of the object, phase variation amounts in the frequency space corresponding to the translational amounts in the real space, rotational amounts in the frequency space corresponding to the rotational amounts in the real space, correlation weights used for weighting the data and weights for interpolation coefficients used for recalculation of at least the part of the correction parameters is calculated as the correction parameters.

17. A magnetic resonance imaging method comprising:

applying a static magnetic field to an object;

applying a gradient magnetic field to the object;

exposing a radio frequency magnetic field pulse inducing a nuclear magnetic resonance to nuclear spins in the object;

detecting echo signals emitted due to the nuclear magnetic resonance;

controlling the gradient magnetic field, the radio frequency magnetic field pulse and detection of the echo signals so as to perform an operation by every repetition time with regard to each of plural blades declining at mutually different angles, the operation being to acquire echo signals for one blade having plural parallel data acquisition loci, in a frequency space in which data of the echo signals is arranged, of which one locus passes an original point in the frequency space within the repetition time;

calculating correction parameters for motion correction of respective pieces of data in plural blades based on correlation information with regard to the plural blades;

correcting the respective pieces of the data in the plural blades based on the correction parameters; and relocating the corrected data in the frequency space and reconstructing an image with Fourier transformation based on the corrected data.

18. A magnetic resonance imaging method of claim 17, wherein the pieces of the data in the plural blades are reconstructed respectively, first correction parameters are calculated for the respective blades so as to raise a cross correlation of pieces of reconstructed data respectively corresponding to the plural blades or based on a relationship between reconstructed data corresponding to a reference blade and reconstructed data corresponding to each blade and second correction parameters are calculated from the first correction parameters based on information with regard to at least one of real-spatial positions and times at which the pieces of the data in the plural blades are acquired.

19. A magnetic resonance imaging method of claim 17, further comprising:

determining adoption and rejection of data to be relocated in the frequency space based on the correlation information with regard to the plural blades.

20. A magnetic resonance imaging method of claim 17, further comprising:

weighting the corrected data to be relocated in the frequency space using weight coefficients based on the correlation information with regard to the plural blades.

* * * * *